United States Patent
Ker et al.

(10) Patent No.: US 7,397,642 B2
(45) Date of Patent: Jul. 8, 2008

(54) ESD PROTECTION CIRCUIT

(75) Inventors: Ming-Dou Ker, Hsin-Chu (TW); Chien-Ming Lee, Taidong (TW)

(73) Assignee: Silicon Integrated Systems Corp. (TW)

( * ) Notice: Subject to any disclaimer, the term of this patent is extended or adjusted under 35 U.S.C. 154(b) by 362 days.

(21) Appl. No.: 11/280,215

(22) Filed: Nov. 17, 2005

(65) Prior Publication Data

US 2007/0030610 A1 Feb. 8, 2007

(30) Foreign Application Priority Data

Aug. 8, 2005 (TW) .............................. 94126719 A

(51) Int. Cl.
*H02H 9/00* (2006.01)
*H02H 1/00* (2006.01)
(52) U.S. Cl. ........................................................ 361/56
(58) Field of Classification Search .................... 361/56
See application file for complete search history.

(56) References Cited

U.S. PATENT DOCUMENTS

| 5,946,177 A * | 8/1999 | Miller et al. .................... 361/56 |
| 6,327,126 B1 * | 12/2001 | Miller et al. .................... 361/56 |
| 6,671,153 B1 * | 12/2003 | Ker et al. ...................... 361/111 |
| 6,690,555 B1 * | 2/2004 | Pasqualini .................... 361/56 |
| 6,954,098 B2 * | 10/2005 | Hsu et al. ..................... 327/313 |
| 7,221,551 B2 * | 5/2007 | Chen ........................... 361/230 |
| 7,289,307 B2 * | 10/2007 | Ker et al. ...................... 361/56 |

* cited by examiner

*Primary Examiner*—Ronald W Leja
(74) *Attorney, Agent, or Firm*—Squire, Sanders & Dempsey, LLP

(57) ABSTRACT

An ESD protection circuit is disclosed. The ESD protection circuit includes a stacked MOS circuit, and a trigger current generator. The object of the stacked MOS circuit is to be the first releasing path of the ESD current; the object of the trigger current generator is to generate the trigger current to turn on the stacked MOS circuit, and then the stacked MOS circuit would be the first releasing path of the ESD current.

16 Claims, 3 Drawing Sheets

ESD PROTECTION CIRCUIT

BACKGROUND OF THE INVENTION

1. Field of the Invention

The present invention relates to an ESD protection circuit, and more particularly relates to an ESD protection circuit that utilizes low voltage sensible components for being a releasing path of the ESD current.

2. Description of the Prior Art

Because of the minuteness of the circuit components and the improvement in precision of the electronic apparatus, the apparatus, the minute electric components inside especially are very sensitive and need protection against the static electricity that is induced by the working environment or touch of a user.

Therefore, most of the precise electric apparatus needs additional design of an ESD protection circuit for suitably releasing static electricity that may occur and protecting the electric components of the circuit in the apparatus against the damage of the high voltage induced by ESD.

An I-V graph of a typical stacked NMOS ESD protection circuit is illustrated in FIG. 1. Referring to FIG. 1, the horizontal coordinate is the voltage difference between the source and the drain and the vertical coordinate is the current of the drain. According to the graph, when the voltage difference between the source and the drain increases, the current of the drain increases correspondingly. After the voltage difference between the source and the drain exceeds a trigger voltage value, the punch through effect will occur that makes the voltage difference start to snap-back till the voltage difference decrease to a holding voltage value. The voltage difference range from the trigger voltage to the holding voltage is called snap-back region. Furthermore, after the voltage difference between the source and the drain decrease to the holding voltage, the voltage difference will increase smoothly, and the current of the drain will increase correspondingly.

Following the description above, when the static electricity voltage exceeds the trigger voltage value, the punch through effect will happen and result in electric conduction of the stacked NMOS as an ESD protection circuit, so the static electricity current is released to the ground through the stacked NMOS. Thus the electric components have been protected against the damage of ESD. However, there are disadvantages for the typical NMOS ESD protection circuit: If the static electricity voltage does not exceed the trigger voltage value, then the ESD protection circuit will not conduct electrically, i.e. the static electricity current will not be released and it will be constantly held in the electric apparatus. It is a instable factor and the user cannot predict when the electric apparatus will be seriously damaged.

A typical stacked NMOS ESD protection circuit in a IC is illustrated in FIG. 2. The object of the IC is to connect semiconductor chips or interfaces of a subsystem that work with different voltages. Therefore there is mixed-voltage inside the IC and the voltage values are Vdd and Vss respectively. Referring to FIG. 2, a I/O pad of the IC is connected to the inner circuit and the drain of the first NMOS (N1), the gate of N1 is connected to the power supply Vdd, the source of N1 is connected to the drain of the second NMOS (N2), the gate of N2 is connected to the power supply Vss and the source of N2 is connected to the ground.

Still referring to FIG. 2, N1 and N2 are connected with cascade configuration and the nodes between them become a common diffusion region as there is a parasite lateral NPN bipolar transistor existed inside the stacked NMOS. When the static electricity voltage exceeds the trigger voltage value, the lateral NPN bipolar transistor will conduct electrically and the static electricity current can be released from the inner circuit. However referring to FIG. 1, if the static electricity voltage does not exceed the trigger voltage value, then the lateral NPN bipolar transistor will not conduct electrically, the static electricity current will not be released and it will be constantly held in the IC. And because the breakdown voltage of the MOS gate oxide decrease in a mixed voltage I/O circuit, finally the static electricity current held in the IC will result in damage of the MOS gate oxide that belongs to the I/O buffer inside the I/O pad.

Considering in a typical ESD protection circuit of above description, when the static electricity exists in the circuit but does not exceed the trigger voltage, the protection circuit will not be active. Thus a protection circuit that is more sensitive to detect and release static electricity is needed for releasing the static electricity that does not exceed the trigger voltage and protecting the components inside the circuit against damage.

SUMMARY OF THE INVENTION

Because of the disadvantages of the typical ESD protection circuit, it is therefore a primary object of the present invention to provide an ESD protection circuit that is more sensitive to release static electricity and reacts to the smaller static electricity voltage instantly.

There is another object of the present invention to provide an ESD protection circuit that is constituted by the low withstanding voltage components and able to carry high voltage static electricity that the static electricity can pass through the circuit and be released.

According to abovementioned objects, the present invention provides an ESD protection circuit that comprises mainly a stacked MOS circuit and a trigger current generation circuit. The object of the stacked MOS circuit is to be the first releasing path of static electricity current; and the object of the trigger current generation circuit is to generate trigger current that makes the stacked MOS circuit electrically conductive that the stacked MOS circuit becomes the first releasing path of static electricity.

DESCRIPTION OF THE PREFERRED EMBODIMENT

The following detailed description of the present invention describes the ESD protection circuit necessary to provide an understanding of the present invention, but does not cover a complete structure composition and the operating theory. While embodiments are discussed, it is not intended to limit the scope of the present invention. Except expressly restricting the amount of the components, it is appreciated that the quantity of the disclosed components may be greater than that disclosed.

Figure 1:
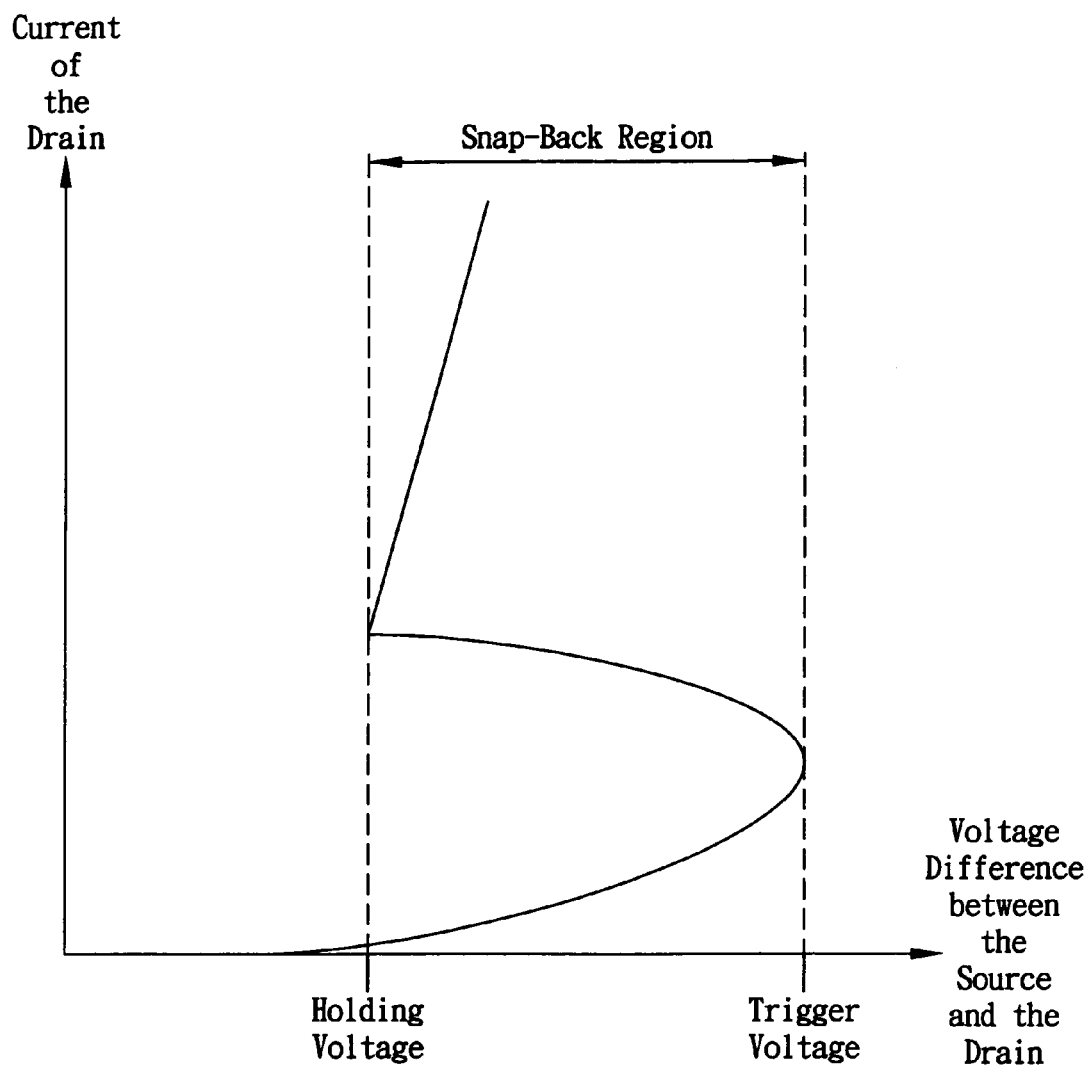
FIG. 1 is an I-V graph of a typical stacked NMOS ESD protection circuit.
Figure 2:
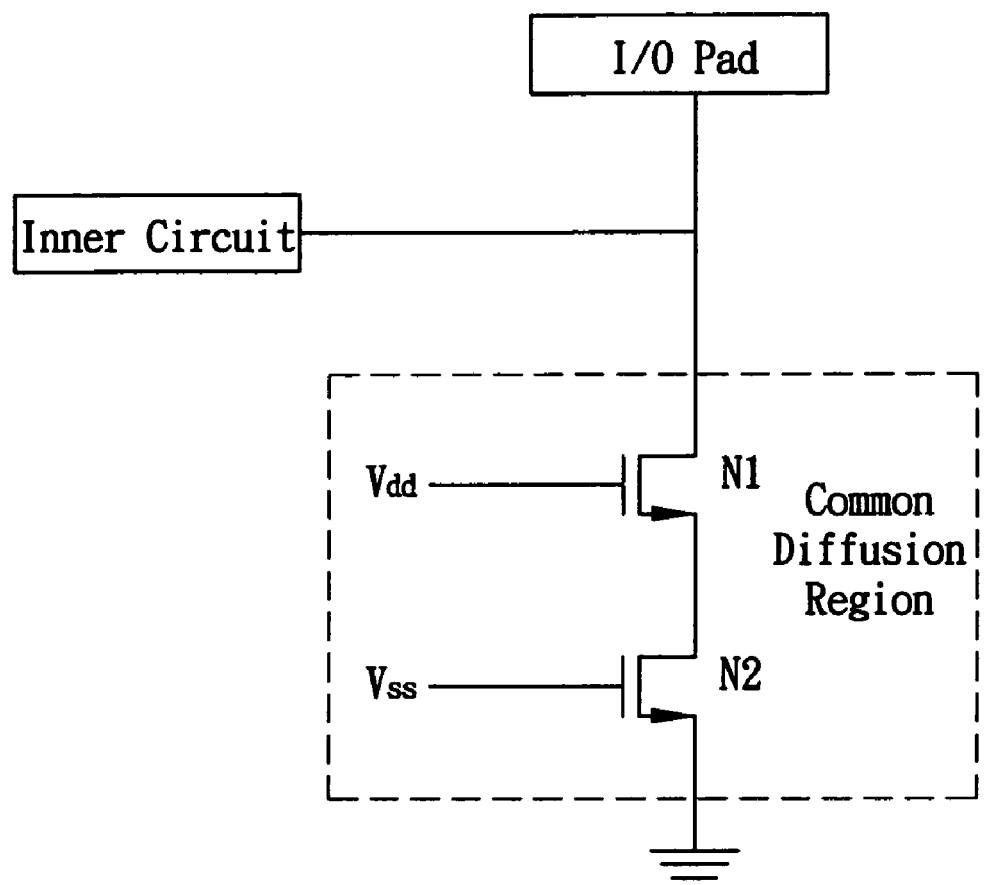
FIG. 2 is a circuit diagram of a typical stacked NMOS ESD protection circuit.
Figure 3:
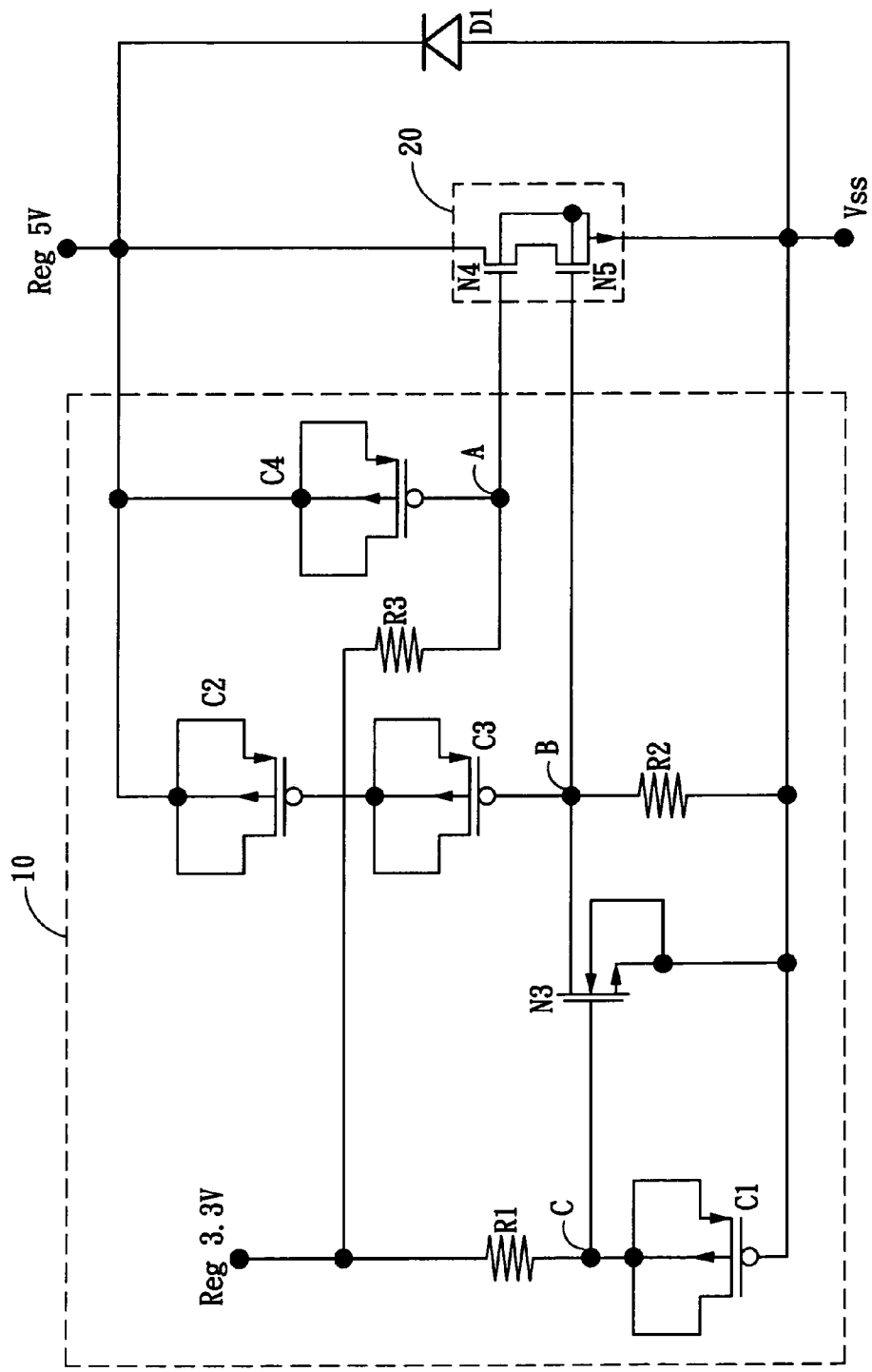
FIG. 3 is an ESD protection circuit diagram of a preferred embodiment of the present invention.

An ESD protection circuit is disclosed in the present invention. The circuit can be utilized inside IC that works with mixed power supplies. And the object of the IC usually is to connect semiconductor chips or interfaces of subsystem that work with different voltages, so there are mixed voltages inside the IC. An ESD protection circuit diagram of a preferred embodiment of the present invention is illustrated in FIG. 3. The circuit comprises: a trigger current generation circuit 10, a stacked MOS circuit 20, and a diode D1.

Wherein the current generation circuit 10 comprises: a first resistor R1, a second resistor R2, a third resistor R3, a first capacitor C1, a second capacitor C2, a third capacitor C3, a fourth capacitor C4 and a third NMOS N3. And the stacked MOS circuit 20 comprises: a fourth NMOS N4 and a fifth NMO4 N5. Referring to FIG. 3, the first end of the first resistor R1 and the first end of the third resistor R3 are connected to the first power supply (Reg3.3 volt), and the second end of the first resistor R1 is connected to the first end of the first capacitor C1. The second end of the first capacitor C1, the source of N3, the second end of the second resistor R2, the source of N5, and the positive electrode of the diode D1 are connected to the ground (i.e. VSS). And in the embodiment the first capacitor C1, the second capacitor C2, the third capacitor C3, and the fourth capacitor C4 are all composed of PMOS. However, the present invention is not limited to PMOS for the capacitors; for instance, the capacitors can be composed of NMOS. Furthermore, the first resistor R1, the second resistor R2, and the third resistor R3 are not only limited to resistor; for instance, the resistors can be composed of other impedances like transistors.

The second end of the first resistor R1 is connected to the gate of N3, and the substrate of N3 is connected to the source of N3. The drain of N3, the first end of the second resistor R2, the second end of the third capacitor C3, and the gate of N5 are connected to each other. The first end of the third capacitor C3 is connected to the second end of the second capacitor C2. The first end of the second capacitor C2, the first end of the fourth capacitor C4, the drain of N4, and the negative electrode of the diode D1 are all connected to the second power supply (Reg5 volt). The second end of the fourth capacitor C4 is connected to the second end of the third resistor R3 and the gate of N4 at the same time. The substrate of N4, N5 and the drain of N5 are mutually connected. The source of N4 is connected to the drain of N5.

In one of the preferred embodiments, every pad in an IC has an ESD protection circuit as FIG. 3. If exterior static electricity enters the ESD protection circuit through the first and the second power supply when the IC chip is not coupled onto a printed circuit board (PCB), then there is voltage at node A and B that makes N4 and N5 electrically conductive in the stacked NMOS circuit 20. Thus the ESD current will release to the ground through the stacked NMOS circuit 20. When the IC chip is coupled onto the PCB, the practical voltage enters through the first power supply and the second power supply respectively. Thus the voltage at the node A equals to the voltage at the first power supply, and therefore N4 is electrically conductive; however the voltage at node C equals to the voltage at the first power supply, thus N3 conducts electrically. Therefore the voltage at the drain of N4 equals to the voltage at the source of N4, and N4 can be thought as the ground. Because node B connects the ground, the voltage at node B results in no electrically conduction of N5. When N5 is not electrically conductive, the inner circuit of the IC (not shown in FIG. 3) works normally and is not affected by the ESD protection circuit because of the electric leakage in the circuit.

Furthermore, the stacked MOS circuit 20 of the present invention is not limited to the NMOS components. In another preferred embodiment of the present invention, the stacked MOS circuit 20 can be made by PMOS components. And because there is a parasite diode in the stacked MOS circuit 20, the diode D1 in FIG. 3 can be ignored.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. An ESD protection circuit, comprising:
   a trigger current generation circuit generating a trigger current; and
   a stacked MOS circuit that receives said trigger current, and then conducts electrically as a first releasing path of ESD;
   wherein said trigger current generation circuit comprises:
   a first resistor, having a first end connecting to a first power supply;
   a first capacitor, having a first end connecting to a second end of said first resistor;
   a first NMOS, having a gate connecting to said second end of said first resistor, and a substrate connecting to a source;
   a second resistor, having a first end connecting to a drain of said first NMOS, a second end connecting to said source of said first NMOS and a second end of said first capacitor, and said second end connecting to a ground;
   a third capacitor, having a second end connecting to said first end of said second resistor;
   a second capacitor, having a second end connecting to a first end of said third capacitor, and a first end connecting to a second power supply;
   a fourth capacitor, having a first end connecting to said first end of said second capacitor and said second power supply; and
   a third resistor, having a second end connecting to a second end of said fourth capacitor, and a first end connecting to said first power supply.

2. The ESD protection circuit of claim 1, wherein said first capacitor, second capacitor, third capacitor, and fourth capacitor are respectively made of MOSFET.

3. The ESD protection circuit of claim 1, wherein said stacked MOS circuit comprises:
   a second NMOS, having a drain connecting to said second power supply and a gate connecting to said second end of said fourth capacitor; and
   a third NMOS, having a drain connecting to a source of said second NMOS, a substrate connecting to a source, said substrate connecting a substrate of said second NMOS to said ground, and a gate connecting to said first end of said second resistor.

4. The ESD protection circuit of claim 3, further comprising:
   a diode, having a first end connecting to said second power supply, and a second end connecting to said ground.

5. The ESD protection circuit of claim 4, when static electricity occurs and results in the voltage at said ground exceeding the voltage at said second power supply, said diode will become a second releasing path of ESD.

6. The ESD protection circuit of claim 3, when the static electricity occurs and results in the voltage at said power supply exceeding the voltage at said ground, said stacked MOS circuit will conduct electrically and become the first releasing path of ESD.

7. An ESD protection circuit, comprising:
a trigger current generation circuit generating a trigger current, comprising:
a first resistor, having a first end connecting to a first power supply;
a first capacitor, having a first end connecting to a second end of said first resistor;
a first NMOS, having a gate connecting to said second end of said first resistor, and a substrate connecting to a source;
a second resistor, having a first end connecting to a drain of said first NMOS, a second end connecting to said source of said first NMOS and a second end of said first capacitor, and said second end connecting to a ground;
a third capacitor, having a second end connecting to said first end of said second resistor;
a second capacitor, having a second end connecting to a first end of said third capacitor, and a first end connecting to a second power supply;
a fourth capacitor, having a first end connecting to said first end of said second capacitor and said second power supply;
a third resistor, having a second end connecting to a second end of said fourth capacitor, and a first end connecting to said first power supply; and
a stacked MOS circuit that receives said trigger current, and then conducts electrically as a first releasing path of ESD, comprising:
a second NMOS, having a drain connecting to said second power supply and a gate connecting to said second end of said fourth capacitor; and
a third NMOS, having a drain connecting to a source of said second NMOS, a substrate connecting to a source, said substrate connecting a substrate of said second NMOS to said ground, and a gate connecting to said first end of said second resistor.

8. The ESD protection circuit of claim 7, wherein said first capacitor, second capacitor, third capacitor, and fourth capacitor are individually made of MOSFET.

9. The ESD protection circuit of claim 7, further comprising: a diode, having a first end connecting to said second power supply, and a second end connecting to said ground.

10. The ESD protection circuit of claim 9, when static electricity occurs and results in the voltage at said ground exceeding the voltage at said second power supply, said diode will become a second releasing path of ESD.

11. The ESD protection circuit of claim 7, when the static electricity occurs and results in the voltage at said second power supply exceeding the voltage at said ground, said stacked MOS circuit will conduct electrically and become the first releasing path of ESD.

12. An ESD protection circuit, comprising:
a first resistor, having a first end connecting to a first power supply;
a first capacitor, having a first end connecting to a second end of said first resistor;
a first NMOS, having a gate connecting to said second end of said first resistor, and a substrate connecting to a source;
a second resistor, having a first end connecting to a drain of said first NMOS, a second end connecting to said source of said first NMOS and a second end of said first capacitor, and said second end connecting to a ground;
a third capacitor, having a second end connecting to said first end of said second resistor;
a second capacitor, having a second end connecting to a first end of said third capacitor, and a first end connecting to a second power supply;
a fourth capacitor, having a first end connecting to said first end of said second capacitor and said second power supply;
a third resistor, having a second end connecting to a second end of said fourth capacitor, and a first end connecting to said first power supply;
a second NMOS, having a drain connecting to said second power supply and a gate connecting to said second end of said fourth capacitor;
a third NMOS, having a drain connecting to a source of said second NMOS, a substrate connecting to a source, said substrate connecting a substrate of said second NMOS to said ground, and a gate connecting to said first end of said second resistor; and
a diode, as a second releasing path of ESD.

13. The ESD protection circuit of claim 12, wherein said first capacitor, second capacitor, third capacitor, and fourth capacitor are capacitors constituted by MOSFET.

14. The ESD protection circuit of claim 12, wherein said diode having a first end connecting to said second power supply, and a second end connecting to said ground.

15. The ESD protection circuit of claim 12, when static electricity occurs and results in the voltage at said ground exceeding the voltage at said second power supply, said diode will become the second releasing path of ESD.

16. The ESD protection circuit of claim 12, when the static electricity occurs and results in the voltage at said second power supply exceeding the voltage at said ground, said second NMOS and third NMOS will conduct electrically and become a first releasing path of ESD.

* * * * *